March 27, 1973 N. F. JACKSEN 3,723,210

METHOD OF MAKING A SEMICONDUCTOR WAFER HAVING CONCAVE RIM

Filed Sept. 29, 1970 2 Sheets-Sheet 1

INVENTOR
NIELS F. JACKSEN
BY
Ostrolenk, Faber, Gerb & Soffen
ATTORNEYS

United States Patent Office 3,723,210 Patented Mar. 27, 1973

3,723,210

METHOD OF MAKING A SEMICONDUCTOR WAFER HAVING CONCAVE RIM

Niels F. Jacksen, Los Angeles, Calif., assignor to International Rectifier Corporation, Los Angeles, Calif.

Filed Sept. 29, 1970, Ser. No. 76,422
Int. Cl. H01l 7/50
U.S. Cl. 156—11 4 Claims

ABSTRACT OF THE DISCLOSURE

Two junctions of a controlled rectifier terminate on a concave rim of a semiconductor wafer. Both junctions terminate at an angle which spreads out the voltage gradient across the junction at the rim. The contour is formed by etching through the wafer and etching under an etch-resistant coating in a channel which circumscribes a surface area of the wafer.

SUMMARY OF THE INVENTION

This invention relates to a semiconductor device and a novel process for its production, wherein a semiconductor wafer has a plurality of parallel junctions which terminate on a concave rim. Consequently, each junction has the proper "taper" for decreasing the electrostatic field gradient across the junction. Where the device contains at least two junctions which must withstand a reverse bias voltage, as in a controlled rectifier, both junctions will have a suitably modified electrostatic field gradient.

The shaping of the periphery of a wafer is well known for the purpose of increasing the reverse voltage-withstanding capability of a junction. Shaping of this type is shown in Pat. 3,179,860 to Clark. When such shaping is applied to a controlled rectifier wafer, the reverse voltage capability of the device is increased. However, the forward blocking voltage capability of the middle junction is decreased. In accordance with the invention, the wafer rim is made concave. Therefore, the lower junction intersects the rim with a positive slope, while the middle junction intersects the rim with a negative slope. Therefore, each junction approaches the wafer edge at an angle which is best for its own reverse voltage conditions.

The invention further provides a novel process for forming such a contour on the rim wherein a channel is cut in the wafer and at least the sides of the channel, and an area circumscribed by the channel are covered with an etch-resistant coating. An acid etch then cuts through the wafer and undercuts the coating, thereby forming the contour.

DETAILED DESCRIPTION OF INVENTION

Figure 1:
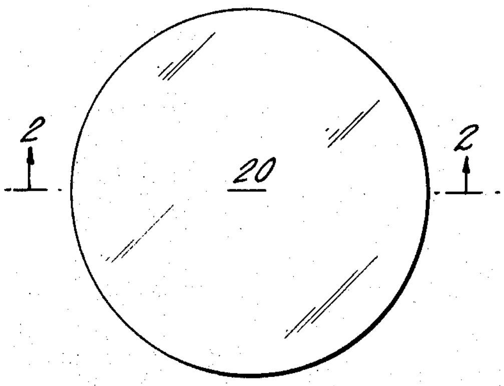
FIG. 1 is a top view of a silicon monocrystalline wafer which may be used for the present invention.
Figure 2:
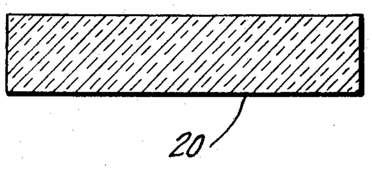
FIG. 2 is a cross-sectional view of FIG. 1 taken across the section line 2—2 in FIG. 1.

FIGS. 1 and 2 illustrate a typical starting wafer 20 which may be processed in accordance with the invention to form a controlled rectifier which is to have a high reverse-voltage rating and a high forward-blocking voltage rating. Wafer 20 is of monocrystalline silicon and may have any desired diameter, depending upon the current rating of the ultimately-formed device. In the described embodiment herein, wafer 20 has the N-type conductivity and has a thickness of about 11 mils.

Figures 3, 4, 5, 6:
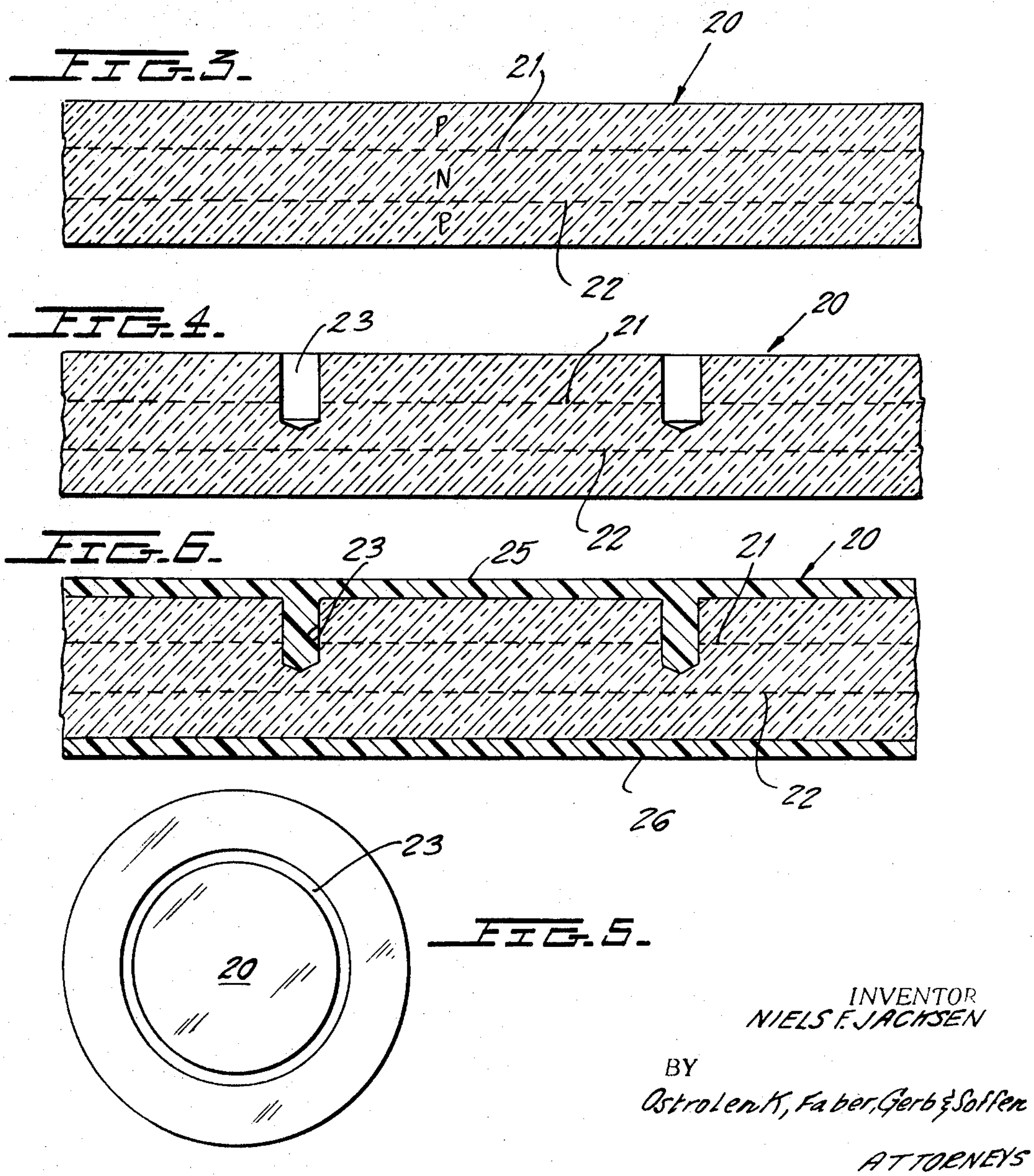
FIG. 3 is a cross-sectional view of a portion of the wafer of FIG. 2 after an initial diffusion operation.
FIG. 4 shows the wafer portion of FIG. 3 after the formation of a groove therein which circumscribes an area of the top of the wafer.
FIG. 5 is a top plan view of the wafer of FIG. 4.
FIG. 6 is a cross-sectional view of a portion of the wafer of FIG. 4 after the top surface thereof and the circumscribing groove are filled or coated with an etch-resistant photoresist coating.

Wafer 20 is exposed to a conventional gallium-diffusion operation to form P-type regions in the upper and lower surfaces of wafer 20, shown in FIG. 3 as the P-type regions which define junctions 21 and 22 with the original N-type material of wafer 20. Preferably, the P-type region at the top and bottom of the wafer of FIG. 3 will have a depth of about 3.5 mils, leaving a "base" region having a thickness of about 4 mils.

As shown in FIGS. 4 and 5, a groove 23 is next formed in the wafer where the groove 23 is illustrated as a circular groove. Obviously, the groove can have any shape and the wafer can have any shaped periphery. It is necessary only that the groove 23 have a configuration which forms a circumscribed area on the top of wafer 20. The groove 23 should have a depth approximately equal to or less than half the thickness of the wafer. By way of example, groove 23 may have a depth of about 4.5 mils and a width of about 1 mil. These dimensions can be varied as necessary and can be varied to compensate for particular groove shapes. The specific shape of groove 23 will depend on the technique used to make the cut.

The top and bottom of the wafer, including the grooves, are then covered with a suitable etch-resistant covering, shown as photoresist coverings 25 and 26, respectively, in FIG. 6. By way of example, the wafer may be dipped into a photoresist solution.

The photoresist is thereafter suitably exposed so that a coating will be left on the wafer which has a lip of about 1 to 2 mils overlapping the exterior diameter of the channel. The exposed photoresist is then stripped away, leaving the coating shown in FIG. 7.

Figures 7, 8, 9, 10, 11, 12, 13:
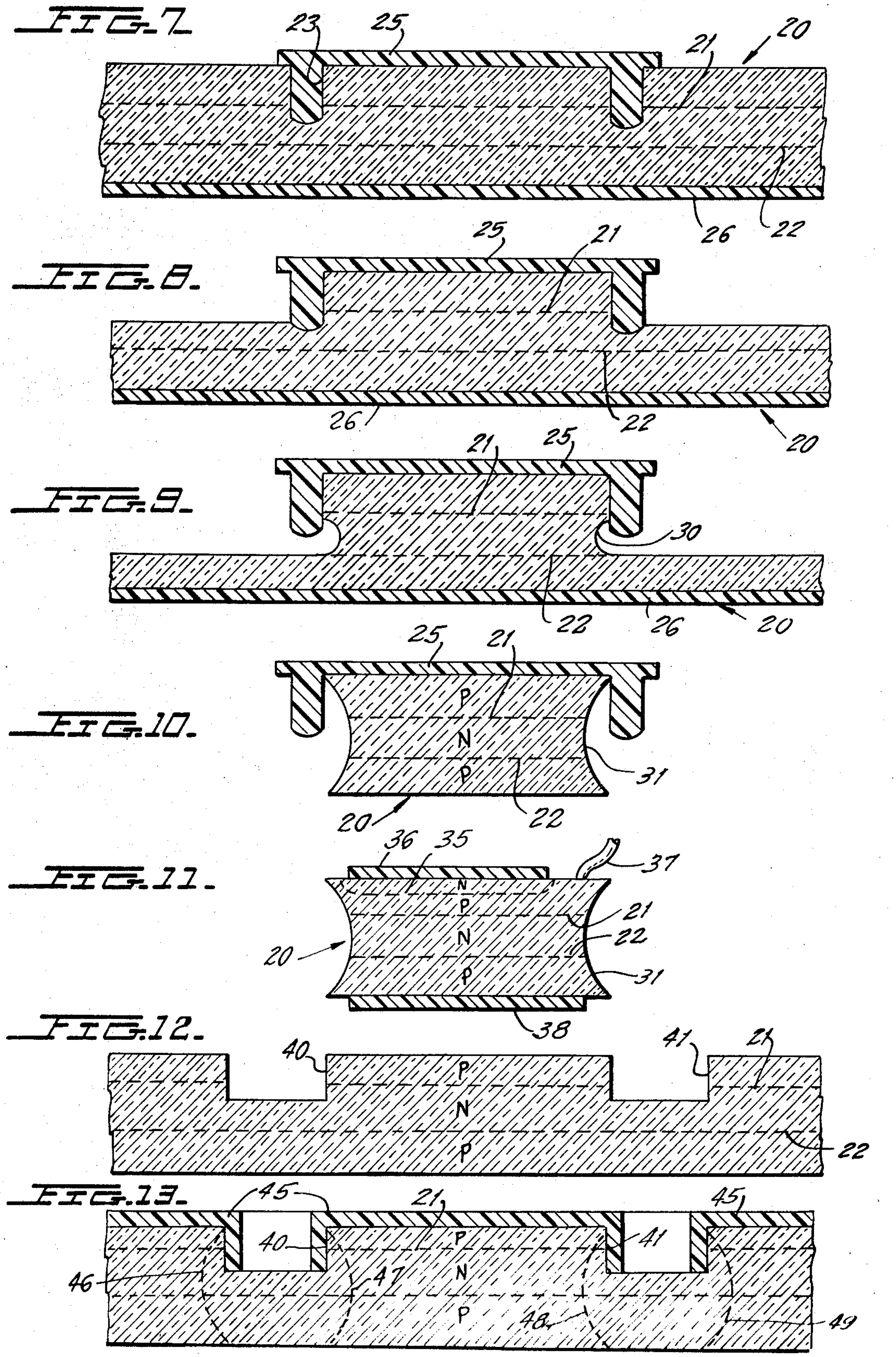
FIG. 7 is a cross-sectional view of the wafer of FIG. 6 after a portion of the upper photoresist coating is removed.
FIG. 8 shows the wafer portion of FIG. 7 after the initiation of the acid-etch operation.
FIG. 9 illustrates the continuation of the acid-etch operation in which undercutting of the acid-resistant cutting commences.
FIG. 10 illustrates the completion of the acid-etch operation.
FIG. 11 illustrates the wafer of FIG. 10 after the formation of a third junction and the attachment of electrodes thereto to define a controlled rectifier device.
FIG. 12 shows a portion of a semiconductor wafer similar to that of FIG. 2 which has been prepared for channels which circumscribe areas of the wafer so that a plurality of dies can be constructed in accordance with the invention.
FIG. 13 shows the wafer portion of FIG. 12 after the application of an etch-resistant coating thereon and illustrates in dotted lines the configuration of the subsequently etched dies.

The wafer is then placed in an acid-etch such as hydrofluoric acid and the acid etches through the entire wafer, as shown in FIGS. 8, 9 and 10.

FIG. 8 shows the etch after it has gone abont half way through the wafer, it being seen that the upper portions of the wafer contained within groove 23 are unaffected by the acid-etch. In FIG. 9, the etch has gone about two-thirds of the way through the wafer and undercutting is seen to begin in region 30 where the acid-etch begins to attack the wafer material beneath the photoresist covering 25. Finally, and by the time the acid-etch has cut completely through the wafer, the undercutting operation has travelled up the wafer side to its top surface so that the wafer will have the appearance shown generally in FIG. 10, where the wafer has a concave rim section 31.

It will be noted that junctions 21 and 22 of FIG. 10 meet the concave rim 31 at an angle such that the electrostatic fields for junctions 21 and 22, when the respective junction is reverse-biased, will be spread out so that these junctions can carry higher rated reverse voltage than if they were at a right angle with the wafer rim. This characteristic is ideally used for a controlled rectifier, which is completed in the fashion shown in FIG. 11 from the wafer of FIG. 10. Thus, after the cutting operation of FIG. 10, the wafer is separated from the coatings 25 and 26 and is suitably cleaned and prepared for the formation of a third junction and suitable electrode alloying. A third and emitter junction 35 may then be formed, for example, by alloying a contact 36 to the upper surface of wafer 20 where the contact 36 will include elements which will create an N-type region. At the same time that contact 36 is alloyed to wafer 20 and forms the emitter junction 35, a gate lead 37 may also be fastened to the upper p-type region. An anode electrode 38 may also be connected to the wafer at the same time. This wafer is then the basic controlled rectifier-type wafer and can be suitably mounted in any desired housing.

As pointed out above, both junctions 21 and 22 may be operated at higher peak inverse voltage since they are contoured appropriately at their intersection with the concave rim 31 of wafer 20. Moreover, this novel concave configuration provides increased area on the upper surface of the wafer (as compared to prior art tapered wafers) for connection to the gate 57. Thus, the gate lead 37 can comprise an aluminum wire which can be easily alloyed to the top P layer. The novel configuration additionally facilitates the use of a center gate configuration or a multigate configuration because of the relatively large outside area available for gate contact connection on the top of the wafer.

FIGS. 12 and 13 illustrate a second embodiment of the novel invention as applied to the production of a plurality of die elements from a common wafer. In FIG. 12, the wafer may be of the type shown in FIGS. 1 and 2 and is of sufficiently large area so that a large number of individual die elements can be formed therefrom.

In FIG. 12, the wafer is initially diffused to form the junctions 21 and 22, as in FIG. 3, but it is then provided with a plurality of circumscribing channels including, for example, channels 40 and 41. This plurality of channels may include channels which are circular in configuration or which may be formed by an intersecting mesh of channels extending at right angles to one another. The channels 40 and 41 are spaced from one another as are the channels at right angles thereto (not shown) by a dimension which determines the ultimate size of the individual die element to be produced. Each of channels 40 and 41 will have a depth of about half the thickness of the wafer, but will have a width which may be substantially larger, for example, 8 mils. The wafer is then provided with a suitable etch-resistant coating which could be the photoresist coating described above, or, if desired, could be a thin wax coating having a thickness of from 1 to 2 mils, shown as coating 45 in FIG. 13. Note that coating 45 adheres to the top of the circumscribed wafer portions and to the sides of grooves 41 and 42.

The wafer is then immersed in a suitable acid-etch which will cause an etching action to proceed so that the individual die elements will ultimately be etch-cut away from one another, with the periphery of the die elements having the concave contours shown in FIG. 13 as the dotted line concave contours 46 to 49. Note that contours 47 and 48 are the contours of a single die which is taken, for example, from the center of the wafer. The individual die elements may then be individually processed in the manner shown in FIG. 11.

Although this invention has been described with respect to preferred embodiments, it should be understood that many variations and modifications will now be obvious to those skilled in the art. Therefore, the scope of this invention is limited not by the specific disclosure herein, but only by the appended claims.

I claim:

1. The process of forming a concave curvature in the rim of a semiconductor wafer which has first and second spaced parallel P-N junctions therein formed by successive layers of P-type, N-type and P-type material respectively; said process comprising the steps of:

(a) cutting at least one groove of a circumscribed area into the upper surface of a wafer and to a depth of about one-half the thickness of said wafer and which terminates about half way between said spaced first and second parallel junctions; and (b) covering the side walls of said groove, the bottom surface of said wafer and the top surface of said wafer over a top surface area extending about 1–2 mils beyond said circumscribed area with an etch-resistant medium; and (c) applying an acid-etch to uncovered portions of the upper surface of said wafer which are external of said etch-resistant medium on the top of said wafer to etch-cut completely through said wafer;

(d) and thereafter removing all remaining etch-resistant medium from said wafer.

2. The process of claim 1 which includes the filling of said groove with said etch-resistant medium before applying said acid-etch.

3. The process of forming a controlled rectifier device in a wafer of semiconductor material in which the rim of said wafer is concave, comprising the steps of:

(a) diffusing impurity elements into the opposite surface of a semiconductor wafer to form first and second parallel junctions therein spaced from one another and parallel to the said opposite surfaces of said wafer; and (b) cutting at least one groove of a circumscribed area into the upper surface of said wafer and to a depth of about one-half the thickness of said wafer and which terminates about half way between said spaced first and second parallel junctions; and (c) covering the side walls of said groove, the bottom surface of said wafer and the top surface of said wafer over a top surface area extending about 1–2 mils beyond said circumscribed area with an etch-resistant medium; and (d) applying an acid-etch to uncovered portions of the upper surface of said wafer which are external of said etch-resistant medium on the top of said wafer to etch-cut completely through said wafer;

(e) and thereafter removing all remaining etch-resistant medium from said wafer.

4. The process of claim 3 which includes the filling of said groove with said etch-resistant medium before applying said acid-etch.

References Cited

UNITED STATES PATENTS

| | | | |
|---|---|---|---|
| 3,140,527 | 7/1964 | Valdman et al. | 29—25.3 |
| 3,575,644 | 4/1971 | Huth et al. | 317—234 R |
| 3,288,662 | 11/1966 | Weissberg | 156—11 |
| 3,054,709 | 9/1962 | Freestone et al. | 156—6 |

JACOB H. STEINBERG, Primary Examiner

U.S. Cl. X.R.

156—17; 317—235, 47